(12) United States Patent
Hong

(10) Patent No.: US 10,168,592 B2
(45) Date of Patent: Jan. 1, 2019

(54) DISPLAY PANEL

(71) Applicant: Samsung Display Co., Ltd., Yongin-si, Gyeonggi-do (KR)

(72) Inventor: Sungchul Hong, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/804,656

(22) Filed: Nov. 6, 2017

(65) Prior Publication Data

US 2018/0129107 A1 May 10, 2018

(30) Foreign Application Priority Data

Nov. 7, 2016 (KR) .......................... 10-2016-0147454

(51) Int. Cl.
| | |
|---|---|
| *H01L 27/02* | (2006.01) |
| *H01L 27/12* | (2006.01) |
| *G02F 1/1362* | (2006.01) |
| *G02F 1/1368* | (2006.01) |

(52) U.S. Cl.
CPC ...... *G02F 1/136204* (2013.01); *G02F 1/1368* (2013.01); *G02F 1/136259* (2013.01); *G02F 1/136286* (2013.01); *H01L 27/0266* (2013.01); *H01L 27/0292* (2013.01); *G02F 2001/136272* (2013.01); *G02F 2001/136295* (2013.01); *H01L 27/124* (2013.01)

(58) Field of Classification Search
CPC .......................... H01L 2251/568; G02F 1/1309
See application file for complete search history.

(56) References Cited

U.S. PATENT DOCUMENTS

| | | | |
|---|---|---|---|
| 6,613,650 B1* | 9/2003 | Holmberg ............. | G02F 1/1309 |
| | | | 257/E21.702 |
| 6,949,468 B2* | 9/2005 | Lee ..................... | H01L 27/3244 |
| | | | 438/713 |
| 9,129,923 B1* | 9/2015 | Han ..................... | H01L 27/3248 |
| 9,147,723 B1* | 9/2015 | Lee ........................ | G09G 3/006 |
| 9,997,737 B2* | 6/2018 | Watabe ............... | H01L 51/5253 |
| 2015/0241747 A1* | 8/2015 | Han ................... | G02F 1/136259 |
| | | | 257/48 |
| 2016/0170544 A1* | 6/2016 | Wang .................... | G06F 3/0416 |
| | | | 345/173 |
| 2018/0074364 A1* | 3/2018 | Hu .................... | G02F 1/133345 |

FOREIGN PATENT DOCUMENTS

| | | |
|---|---|---|
| KR | 20050040235 | 5/2005 |
| KR | 20100078368 | 7/2010 |
| KR | 101133751 B1 | 4/2012 |
| KR | 101571775 B1 | 12/2015 |

\* cited by examiner

*Primary Examiner* — Edward Chin
(74) *Attorney, Agent, or Firm* — Innovation Counsel LLP

(57) ABSTRACT

A display panel has a substrate structure in which a short bar connected to a gate line of an electrostatic discharge protection transistor in a non-display area is also used as a repair line for reparing disconnection in a data line. The display panel is capable of protecting a driving circuit of the display panel from static electricity that may occur during a manufacturing process and has a reduced size of the non-display area by using the short bar as the repair line.

15 Claims, 9 Drawing Sheets

[FIG 1]
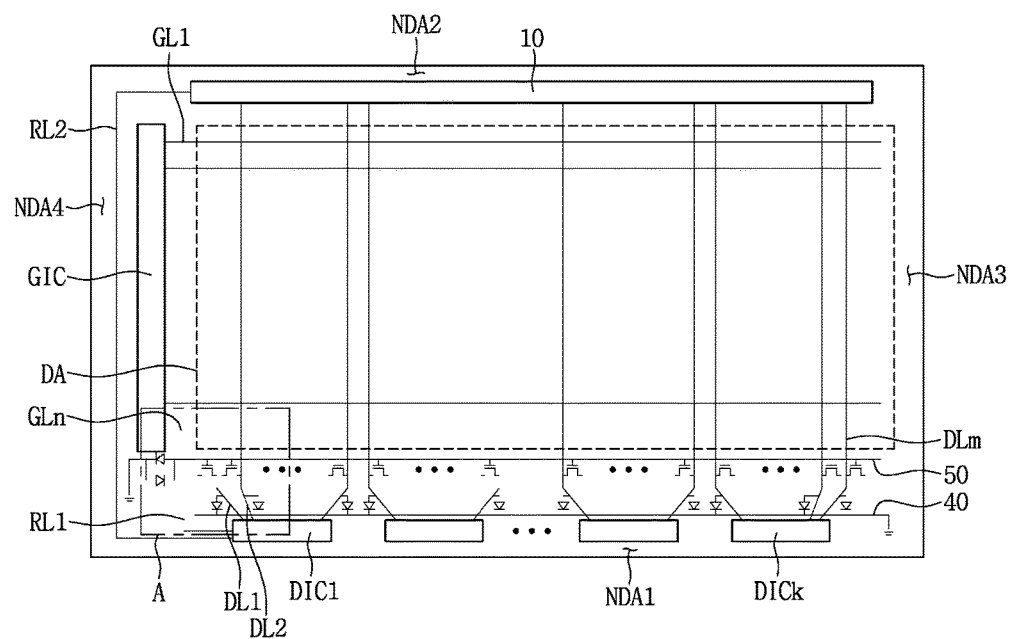

[FIG 2]
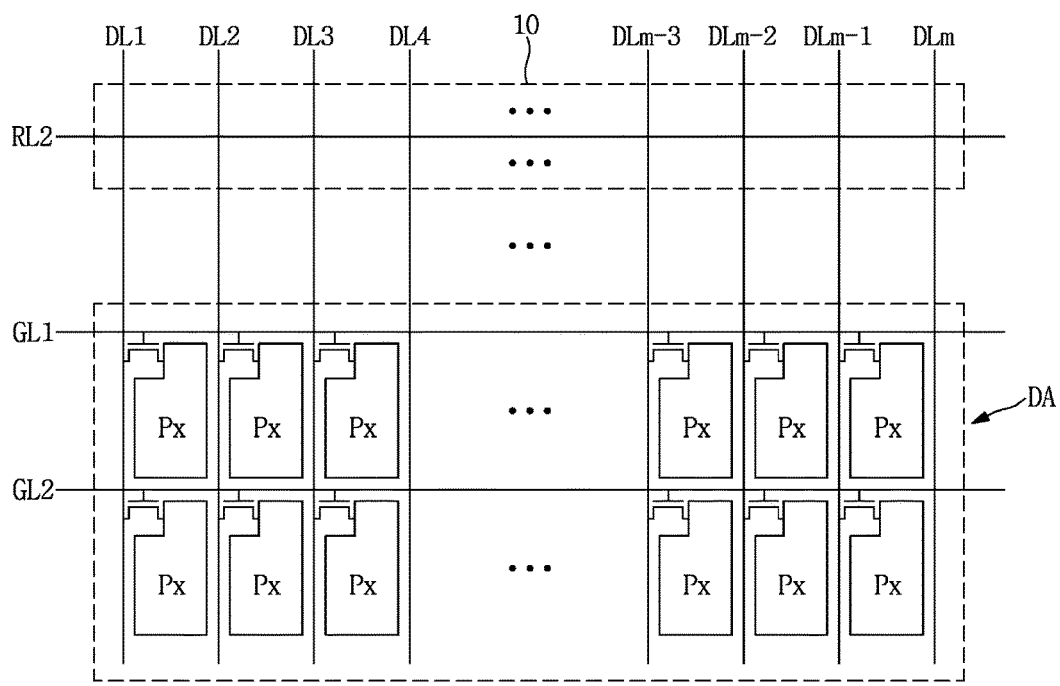

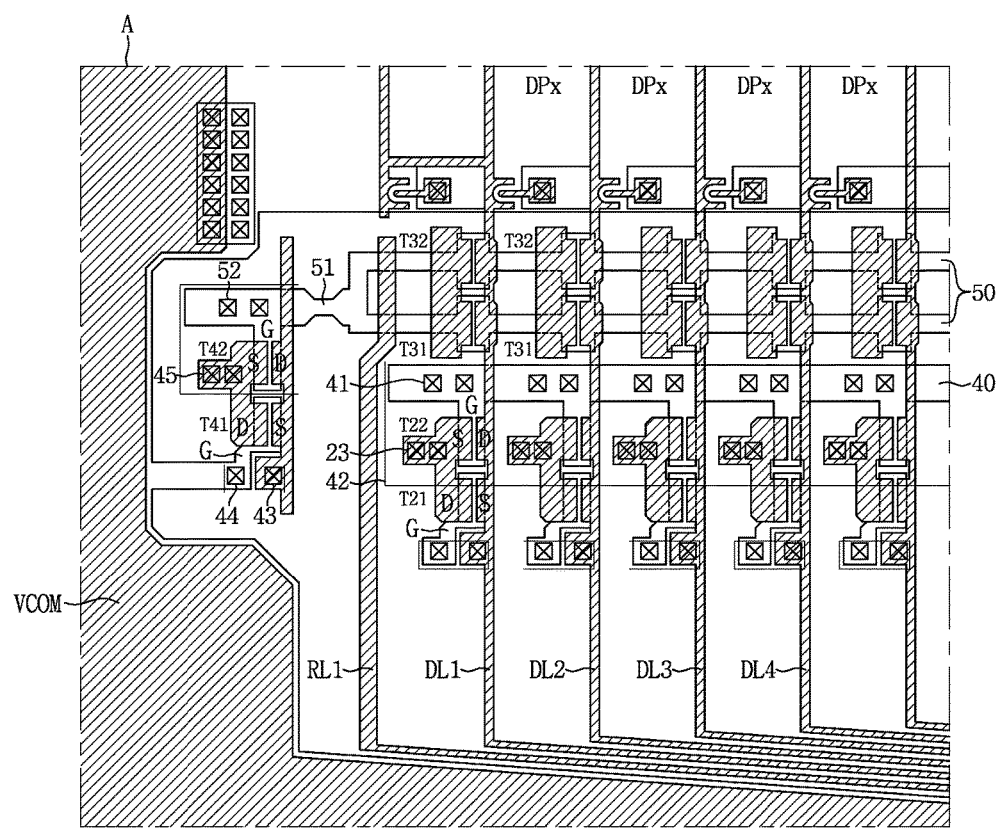
[FIG 3]

[FIG 4]
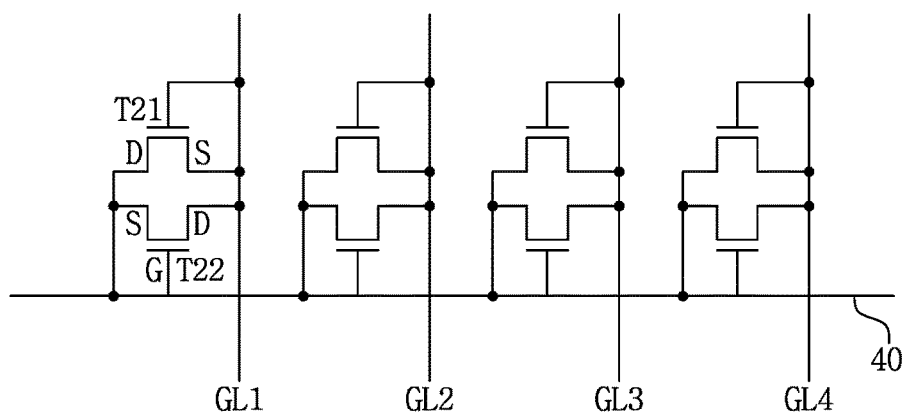

[FIG 5]
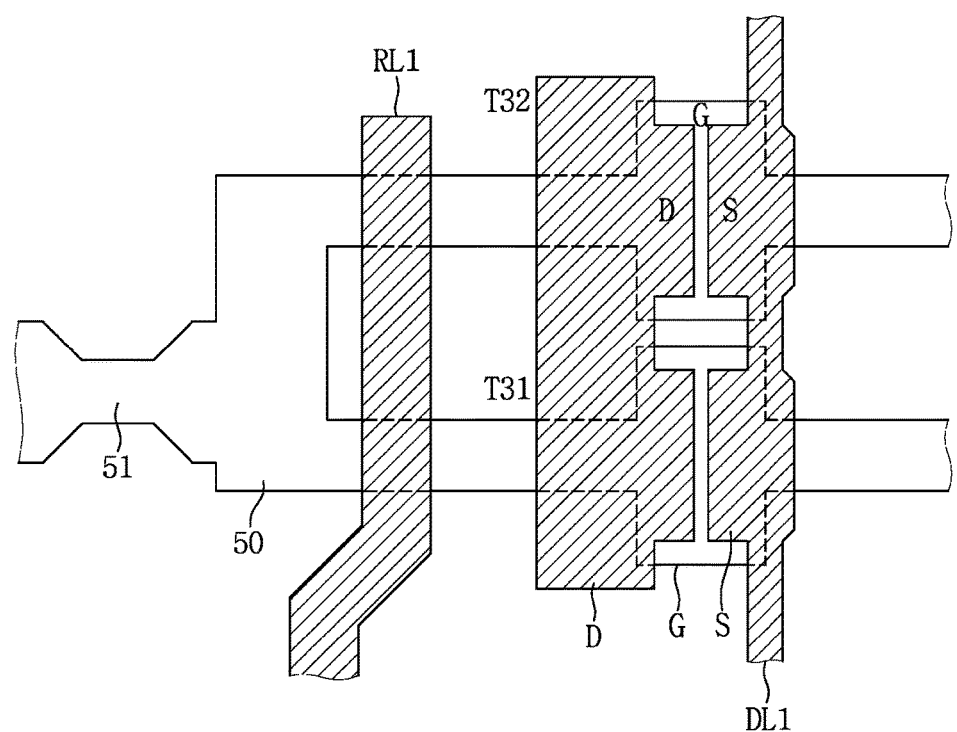

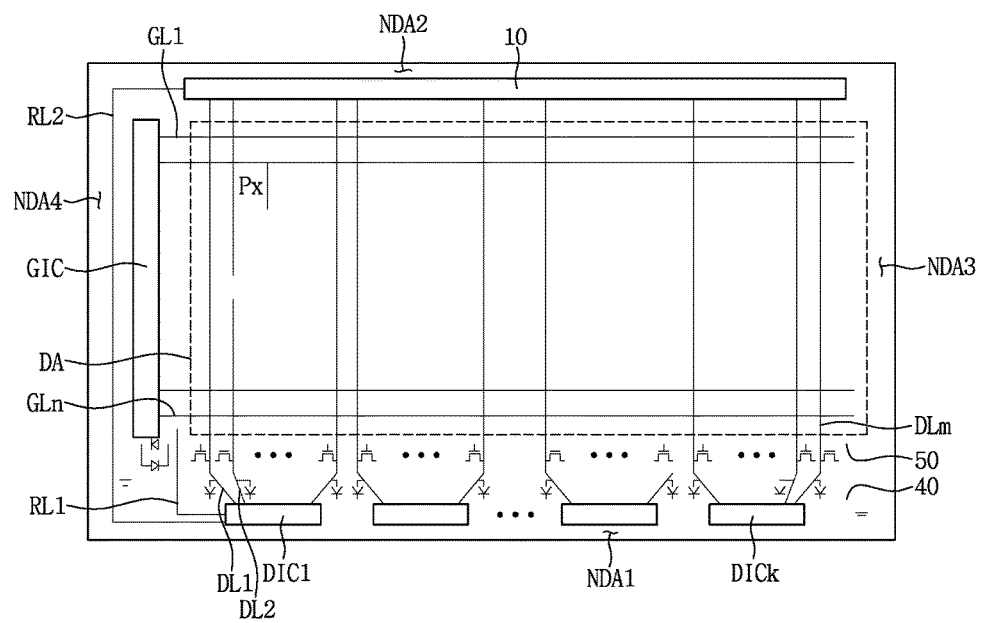
[FIG 6]

[FIG 7]
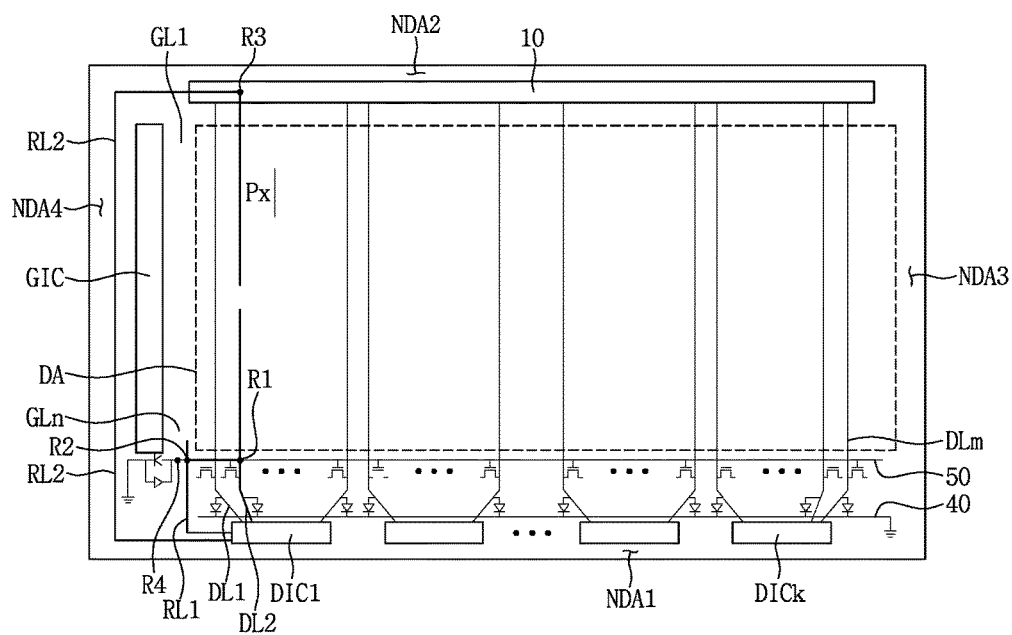

[FIG 8A]
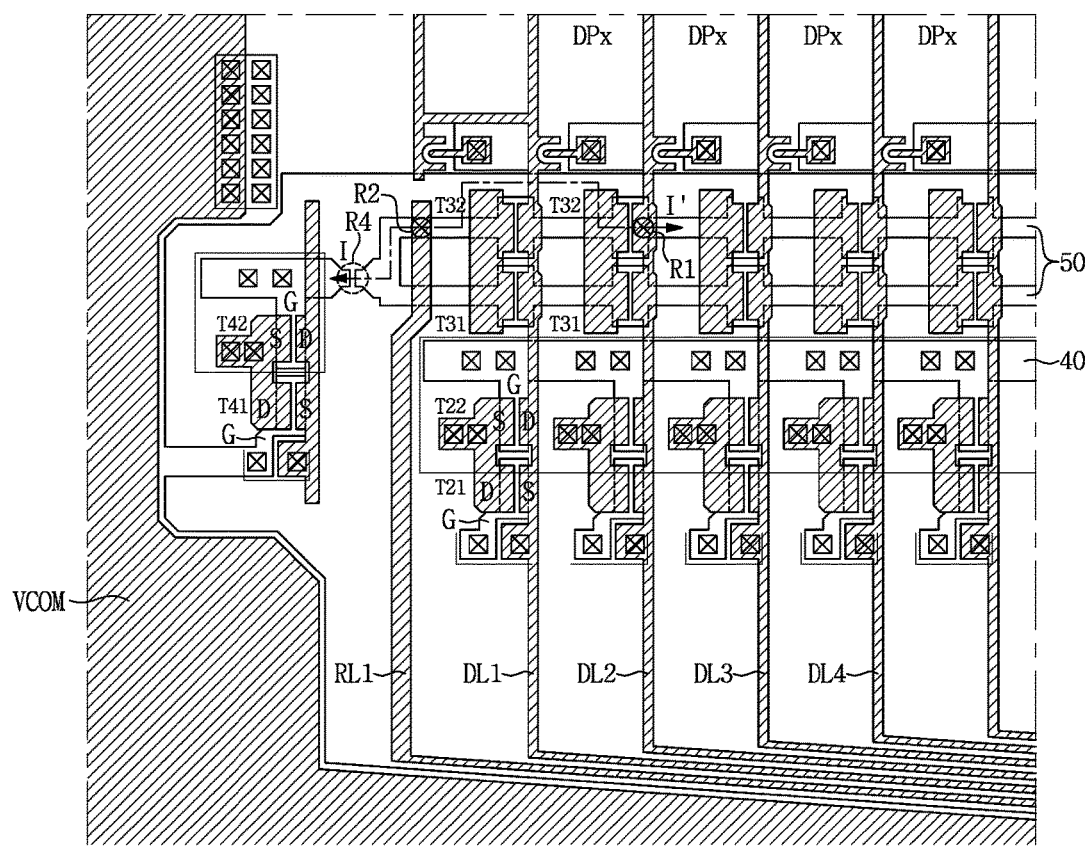

[FIG 8B]
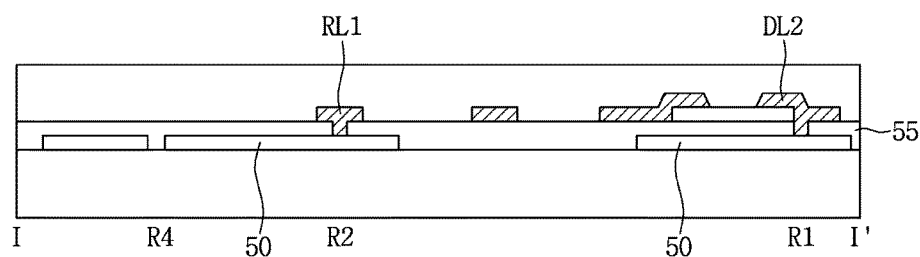
[FIG 8C]
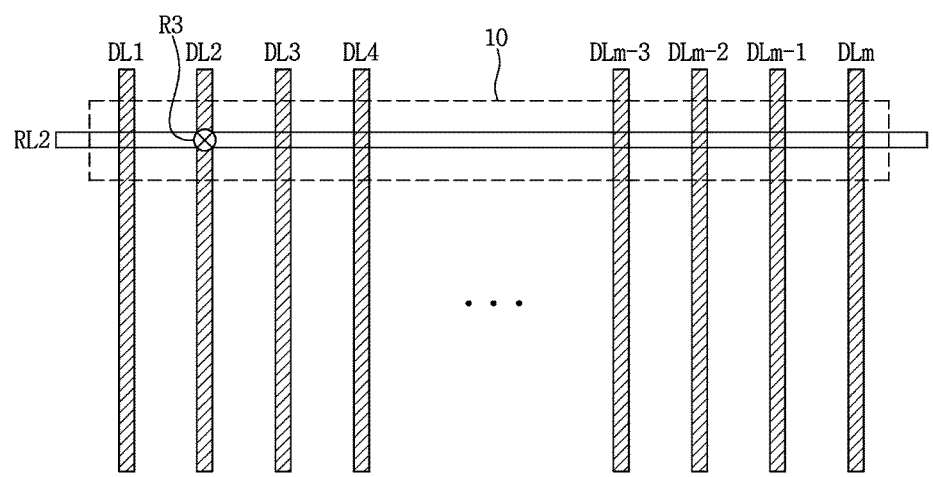

DISPLAY PANEL

CROSS-REFERENCE TO RELATED APPLICATION

This application claims priority under 35 U.S.C. § 119 to Korean Patent Application No. 10-2016-0147454, filed on Nov. 7, 2016, in the Korean Intellectual Property Office (KIPO), the disclosure of which is incorporated by reference herein in its entirety.

1. TECHNICAL FIELD

Embodiments of the present disclosure relate to a display panel, e.g., a liquid crystal display ("LCD") panel, in which a repair line for repairing disconnection defects of a data line and a short bar of an electrostatic discharge (ESD) protection transistor for protecting a driving circuit of the display panel from static electricity are formed in a single structure.

2. DISCUSSION OF RELATED ART

As the information society has advanced rapidly, there has been a need for flat panel display devices having desired characteristics such as slimness, light weight, and low power consumption. Among the flat panel display devices, LCD devices have superior characteristics for high resolution, color display, image quality, and the like that are adequate for applications to notebook computers and desktop monitors.

A typical LCD device includes two substrates on which electrodes respectively formed, and a liquid crystal material is injected between the two substrates. Liquid crystal molecules of the liquid crystal material may move based on an electric field that is formed by applying a voltage between the two electrodes. The LCD device may display an image based on light transmittance that varies depending on the movement of the liquid crystal molecules.

The LCD device includes an LCD panel in which liquid crystal molecules are injected between two substrates, a backlight positioned below the LCD panel and used as a light source, and a driving unit for driving the LCD panel.

The driving unit includes a driving circuit for applying a signal to a line, e.g., a data line, of the LCD panel. The driving circuit may be classified into a chip on glass (COG) type, a tape carrier package (TCP) type, and a chip on film (COF) type depending on the scheme of mounting the driving circuit on the LCD panel.

In the case of a display panel of the LCD device in which the driving circuit and the LCD panel are mounted on a substantially same substrate, manufacturing processes of the display panel such as depositing, etching, etc. on can cause defects such as a damage on an element by electrostatic discharge (ESD) or a damage on an insulating layer, resulting in the reduction in yield. In addition, even after the display panel is manufactured, static electricity generated from the outside may cause a damage to a pixel driving circuit of the LCD device through the driving circuit.

Various techniques for substantially preventing or distributing the static electricity have been implemented, for example, by inserting a protection circuit or a diode. However, the mounting of the ESD protection circuit on the substrate may increase the size of the non-display area of the display panel. In addition, in the case where a line width of a data line is reduced in order not to increase the non-display area, a line resistance of the data line may increase causing a problem in transferring a driving signal.

It is to be understood that this background section is intended to provide background for understanding the present disclosure, and the background section may include ideas, concepts, or recognitions that were not part of what was known or appreciated by those skilled in the pertinent art prior to a corresponding effective filing date of the subject matter disclosed herein.

SUMMARY

Embodiments of the present disclosure are directed to a display panel including a short bar of an ESD protection transistor that also serves as a repair line for repairing disconnection of a data line.

According to an exemplary embodiment, a display panel includes: a substrate including a display area, a first non-display area, and a second non-display area, the first non-display area and the second non-display area facing each other with the display area disposed therebetween; a gate line disposed on the substrate and extending in a first direction; a data line disposed on the substrate and extending in a second direction which intersects the first direction; a data driving unit generating a driving signal applied to the data line; an electrostatic discharge protection transistor unit disposed in the first non-display area and including a thin film transistor, one of a source electrode and a drain electrode of the thin film transistor being connected to the data line; a transistor short bar connected to a gate electrode of the thin film transistor; a first repair line overlapping the transistor short bar on a plane; and a second repair line electrically connected to the first repair line and overlapping the data line on the plane in the second non-display area.

The first repair line may be disposed on a different layer from a layer on which the second repair line is disposed, and the first repair line may be connected to the second repair line through a through-hole.

The first repair line and the data line may include a substantially same material.

The second repair line and the gate line may include a substantially same material.

One of the source electrode and the drain electrode of the thin film transistor that is not connected to the data line may be floated.

The display panel may further include an electrostatic discharge protection diode connected between the transistor short bar and a common electrode.

The transistor short bar may include a narrow portion between the thin film transistor and the electrostatic discharge protection diode, and a width of the narrow portion may be less than a width of a wiring connected to the electrostatic discharge protection diode.

The narrow portion may not overlap another metal layer on the plane.

The electrostatic discharge protection transistor unit may include a plurality of thin film transistors connected in parallel to each other.

The one of the source electrode or the drain electrode of the thin film transistor connected to the data line may be electrically connected to the transistor short bar, the transistor short bar may be electrically connected to the first repair line at a portion of the transistor short bar overlapping the first repair line, and the second repair line may be electrically connected to the data line at a portion of the second repair line overlapping the data line.

According to another exemplary embodiment, a display panel includes: a substrate including a display area, a first non-display area, and a second non-display area, the first non-display area and the second non-display area facing each other with the display area disposed therebetween; a gate line disposed on the substrate and extending in a first direction; a data line disposed on the substrate and extending in a second direction that intersects the first direction; a data driving unit generating a driving signal applied to the data line; an electrostatic discharge protection transistor unit disposed in the first non-display area and including a thin film transistor, one of a source electrode and a drain electrode of the thin film transistor being connected to the data line; a transistor short bar connected to a gate electrode of the thin film transistor; a first repair line overlapping the transistor short bar on a plane; a signal amplifier connected to the first repair line and configured to amplify a driving signal of the first repair line; and a second repair line connected to an output terminal of the signal amplifier and overlapping the data line on the plane in the second non-display area.

The data driving unit may include the signal amplifier.

The first repair line and the data line may include a substantially same material.

The second repair line and the gate line may include a substantially same material.

The one of the source electrode or the drain electrode of the thin film transistor connected to the data line may be electrically connected to the transistor short bar, the transistor short bar may be electrically connected to the first repair line at a portion of the transistor short bar overlapping the first repair line, and the second repair line may be electrically connected to the data line at a portion of the second repair line overlapping the data line.

The foregoing is illustrative only and should not be construed to be in any way limiting. In addition to the illustrative aspects, exemplary embodiments and features described above, further aspects, exemplary embodiments, and features will become apparent by reference to the drawings and the following detailed description.

BRIEF DESCRIPTION OF THE DRAWINGS

A more complete appreciation of the present disclosure will become more apparent by describing in detail exemplary embodiments thereof with reference to the accompanying drawings, wherein:

FIG. 1 is a plan view illustrating a display panel according to an exemplary embodiment;

FIG. 2 is a plan view illustrating a repair terminal portion of FIG. 1;

FIG. 3 is a plan view illustrating area A of FIG. 1;

FIG. 4 is a circuit diagram illustrating a configuration of an ESD protection diode;

FIG. 5 is a plan view illustrating an ESD protection transistor illustrated in FIG. 3;

FIG. 6 is a mimetic view illustrating a disconnection state of a data line;

FIG. 7 is a mimetic view illustrating a repair state of the disconnected data line;

FIG. 8A is a plan view illustrating area A of FIG. 1;

FIG. 8B is a cross-sectional view taken along line I-I' of FIG. 8A; and

FIG. 8C is a plan view illustrating a second non-display area of the display panel.

DETAILED DESCRIPTION

Exemplary embodiments of the present disclosure will now be described more fully hereinafter with reference to the accompanying drawings. Although the present disclosure may be modified in various manners and have several exemplary embodiments, exemplary embodiments are illustrated in the accompanying drawings and will be mainly described in the specification. However, the scope of the present disclosure is not limited to the exemplary embodiments and should be construed as including various changes, equivalents and substitutions included in the spirit and scope of the present disclosure.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper," and the like, may be used herein for ease of description to describe the relations between one element or component and another element or component as illustrated in the drawings. It will be understood that the spatially relative terms are intended to encompass different orientations of a device in use or operation, in addition to the orientation depicted in the drawings. For example, in the case where the device illustrated in the drawing is turned over, the device positioned "below" or "beneath" another device may be placed "above" another device. Accordingly, the term "below" may include both the lower and upper positions. The device may also be oriented in another direction and thus the spatially relative terms may be interpreted differently depending on the orientation.

Throughout the specification, when an element is referred to as being "connected" to another element, the element is "directly connected" to another element, or "electrically connected" to another element with one or more intervening elements interposed therebetween. It will be further understood that the terms "comprises," "including," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, terms used herein (including technical and scientific terms) have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts that are not associated with the description may not be provided in order to specifically describe embodiments of the present disclosure and like reference numerals refer to like elements throughout the specification.

FIG. 1 is a plan view illustrating a display panel according to an exemplary embodiment.

Referring to FIG. 1, a display panel includes a plurality of gate lines GL1 to GLn, a plurality of data lines DL1 to DLm, and a plurality of repair lines RL1 and RL2. A planar area of the display panel may include a display area DA and a plurality of non-display areas NDA1, NDA2, NDA3 and NDA4 that are arranged around the display area DA. The gate lines GL1 to GLn are insulated from and cross the data lines DL1 to DLm in the display area DA of the display panel, where m and n are integers greater than zero.

Referring to FIG. 2, in the display area DA, the display panel includes a plurality of pixels PX arranged in areas where the gate lines GL1 to GLn intersect the data lines DL1 to DLm. The pixels PX may be arranged in "n" number of rows and "m" number of columns intersecting each other.

The gate lines GL1 to GLn may extend substantially in a row direction and transmit a gate signal including a gate-on voltage that may turn on a switching element, e.g., a thin film transistor, connected to each pixel PX and a gate-off voltage that may turn off the switching element.

The data lines DL1 to DLm may extend substantially in a column direction and transmit a data voltage corresponding to a gray level of the switching element that is connected to each pixel PX.

The pixel PX is a unit for displaying an image. For example, one pixel PX may uniquely display one of primary colors, or a plurality of pixels PX may alternately display the primary colors over time, thereby displaying a desired color by the spatial or temporal sum of the primary colors.

The first non-display area NDA1 is defined as an area adjacent to a lower side of the display area DA, the second non-display area NDA2 is defined as an area adjacent to an upper side of the display area DA, the third non-display area NDA3 is defined as an area adjacent to a right side of the display area DA, and the fourth non-display area NDA4 is defined as an area adjacent to a left side of the display area DA.

Data driving units DIC1 to DICk may be disposed in the first non-display area NDA1. The data driving units DIC1 to DICk receive image data (not illustrated) externally input thereto, convert the image data into a data driving signal using a gray level voltage that is generated by a gray level voltage generator (not illustrated), and apply the data driving signal to the data lines DL1 to DLm. The data driving signal may include a positive polarity data voltage and a negative polarity data voltage, and the positive polarity data voltage and the negative polarity data voltage may be applied to the data lines DL1 to DLm alternately with respect to a frame, a row, and/or a column.

In addition, ESD protection transistors T31 and T32 (see FIG. 3) may be disposed in the first non-display area NDA1. Referring to FIGS. 3 and 5, at the ESD protection transistors T31 and T32, the first data line DL1 and a source electrode (or a drain electrode) are connected to each other. In the descriptions with reference to FIG. 3, an electrode of the ESD protection transistors T31 and T32 connected to the data lines DL1 to DLm is defined as the source electrode S for ease of description. The ESD protection transistors T31 and T32 may be connected to data lines DL2 to DLm in addition to the first data line DL1.

The drain electrodes D of the ESD protection transistors T31 and T32 are not electrically connected to the outside, thus being floated. Gate electrodes G of the ESD protection transistors T31 and T32 are connected to a transistor short bar 50. The transistor short bar 50 shorts the gate electrodes G of the plurality of ESD protection transistors T31 and T32 connected to the data lines DL1 to DLm and extends to be insulated from and intersect the data lines DL1 to DLm. The ESD protection transistors T31 and T32 are also referred to as a ticks transistor and serve to allow high-voltage static electricity flowing through the data lines DL1 to DLm to flow to the transistor short bar 50.

One end of the transistor short bar 50 is connected to ESD protection transistors T41 and T42. Each of the ESD protection transistors T41 and T42 is diode-connected to form ESD protection diodes including a forward diode and a reverse diode that are connected in parallel. In this regard, ESD protection transistors and ESD protection diodes may be interchangeably used herein without departing from the scope of the present disclosure. One end of each of the ESD protection diodes T41 and T42 may be connected to the transistor short bar 50, and another end of each of the ESD protection diodes T41 and T42 may be connected to a common electrode VCOM having a common electric potential. The ESD protection diodes T41 and T42 serve to discharge the high-voltage static electricity into the common electrode VCOM through the transistor short bar 50. Although the present example shows that the ESD protection transistors T41 and T42 are diode-connected to function as ESD protection diodes, the present disclosure is not limited thereto. For example, discrete diodes may be used and connected in parallel instead of diode-connected ESD protection transistors.

Referring again to FIG. 1, the first repair line RL1 and the second repair line RL2 may be disposed in the first non-display area NDA1. Arranged in parallel to the data lines DL1 to DLm, the first repair line RL1 is insulated from and intersects the transistor short bar 50. The first repair line RL1 may be formed substantially simultaneously with the data lines DL1 to DLm, and the transistor short bar 50 may be formed substantially simultaneously with the gate lines GL1 to GLn.

The first repair line RL1 may be connected to the first data driving unit DIC1. The first data driving unit DIC1 may amplify a signal of the first repair line RL1. The first data driving unit DIC1 may serve to amplify a data driving signal of the first repair line RL1 and output the amplified data driving signal, when disconnection occurs in one of the data lines DL1 to DLm.

The second repair line RL2 may be disposed on a substantially same layer as a layer on which the gate lines GL1 to GLn are disposed. The second repair line RL2 may be connected from the first non-display area NDA1 to a repair terminal portion 10 disposed in the second non-display region NDA2. The second repair line RL2 may receive the data driving signal output from the first data driving unit DIC1 and transmit the data driving signal to the data line DL disposed in the second non-display area NDA2. The second repair line RL2 is insulated from and intersects the data lines DL1 to DLm at the repair terminal portion 10.

FIG. 2 is a plan view illustrating the repair terminal portion of FIG. 1.

Referring to FIG. 2, the repair terminal portion 10 disposed in the second non-display area NDA2 includes the data lines DL1 to DLm extending from the display area DA and the second repair line RL2 extending from the first non-display area NDA1.

The second repair line RL2 is electrically connected to an output terminal of the data driving units DIC1 to DICk in the first non-display area NDA1 and extends to the second non-display area NDA2 via the fourth non-display area NDA4 as illustrated in FIG. 1. In the repair terminal portion 10, the second repair line RL2 is parallel to the gate lines GL1 to GLn, and is insulated from and intersects the data lines DL1 to DLm. The second repair line RL2 and the gate lines GL1 to GLn may be formed substantially simultaneously and include a substantially same material.

Although not explicitly illustrated in FIG. 1, the second repair line RL2 may be directly connected to the first repair line RL1. The second repair line RL2 and the first repair line RL1 may directly contact each other through a through-hole (not illustrated) depending on the size and structure of the display panel. In the case where the second repair line RL2 directly contacts the first repair line RL1, the data driving signal may not be amplified by the data driving unit DIC.

FIG. 3 is a plan view illustrating area A of FIG. 1, FIG. 4 is a circuit diagram illustrating a configuration of an ESD protection diode, and FIG. 5 is a plan view illustrating an ESD protection transistor illustrated in FIG. 3.

Referring to FIGS. 1, 2, 3, and 4, the first data line DL1 is connected to the first data driving unit DIC1 and extends to the second non-display area NDA2 via the display area DA. The first data line DL1 may be connected to ESD protection transistors T21 and T22 and the ESD protection transistors T31 and T32 at the first non-display area NDA1.

The ESD protection transistors T21 and T22 connect a diode short bar 40 and the data lines DL1 to DLm. Each of the ESD protection transistors T21 and T22 is diode-connected to form a pair of ESD protection diodes that are connected to each other. In general, a diode-connected transistor has a gate electrode G that is connected to either a source electrode S or a drain electrode D to function as a diode that allows current to flow only in one direction. In this regard, ESD protection transistors and ESD protection diodes may be interchangeably used herein without departing from the scope of the present disclosure. When static electricity flows into the data line DL, the ESD protection transistors (or diodes) T21 and T22 may substantially prevent breakdown and malfunction of the display panel by distributing the static electricity to an adjacent data line DL through the diode short bar 40. Although the present example shows that the ESD protection transistors T21 and T22 are diode-connected to function as ESD protection diodes, the present disclosure is not limited thereto. For example, discrete diodes may be used and connected in parallel instead of diode-connected ESD protection transistors.

A source electrode S of the first ESD protection transistor T21 is formed by extending from the data line DL, and a gate electrode G of the first ESD protection transistor T21 is connected to the data line DL through through-holes 21 and 22. A drain electrode D of the second ESD protection transistor T22 is formed by extending from the data line DL, and a source electrode S and a gate electrode G of the second ESD protection transistor T22 are connected to the diode short bar 40 through through-holes 23 and 41 and a bridge electrode 42. In addition, a drain electrode D of the first ESD protection transistor T21 and the source electrode S of the second ESD protection transistor T22 are connected to each other. Accordingly, the drain electrode D of the first ESD protection transistor T21 is also connected to the diode short bar 40.

The first and second ESD protection transistors T21 and T22 are respectively connected in a forward direction and a reverse direction between the data line DL and the diode short bar 40 to allow current to flow two-way directions of terminals connected thereto.

Referring to FIGS. 3, 4 and 5, the third ESD protection transistor T31 and the fourth ESD protection transistor T32 are disposed between the common electrode VCOM and the data line DL. In such an exemplary embodiment, a source electrode S of the third ESD protection transistor T31 is connected to the data line DL and a gate electrode G of the third ESD protection transistor T31 is connected to the transistor short bar 50. A drain electrode D of the third ESD protection transistor T31 is not connected to an external electrode line, thus being floated.

The fourth ESD protection transistor T32 that has a substantially same structure as that of the third ESD protection transistor T31 is arranged in parallel to the third ESD protection transistor T31. A source electrode S of the fourth ESD protection transistor T32 is connected to the data line DL and a gate electrode G of the fourth ESD protection transistor T32 is connected to the transistor short bar 50. A drain electrode D of the fourth ESD protection transistor T32 is connected to the drain electrode D of the third ESD protection transistor T31 and becomes floated, as not being connected to an external electrode line.

The ESD protection transistors T31 and T32 are generally configured to capture static electricity that flows into the data line DL during a manufacturing process. That is, the ESD protection transistors T31 and T32 that are connected to the data line DL may be destroyed, instead of thin film transistors of the pixel being destroyed, by the static electricity that may be generated during the manufacturing process. The ESD protection transistors T31 and T32 may be arranged in parallel to efficiently block static electricity through other ESD protection transistors even if a part of the ESD protection transistors are damaged when static electricity flows several times during the manufacturing process. Although only two ESD protection transistors T31 and T32 are depicted in FIGS. 3 and 5, it is to be understood that three or more ESD protection transistors may be formed in parallel.

The transistor short bar 50 extends to intersect the plurality of data lines DL1 to DLm and is connected to the gate electrodes G of the third and fourth ESD protection transistors T31 and T32. In addition, the transistor short bar 50 is connected to the common electrode VCOM through the ESD protection transistors T41 and T42. Source electrodes S of the fifth and sixth ESD protection transistors T41 and T42 are connected to gate electrodes G of the fifth and sixth ESD protection transistors T41 and T42, respectively to function as a diode. The two ESD protection ESD protection T41 and T42 are diode-connected in forward and reverse directions in parallel to each other. The source electrode S of the fifth ESD protection transistor T41 is connected to the common electrode VCOM through through-holes 43 and 44, and the gate electrode G of the fifth ESD protection transistor T41 is also connected to the common electrode VCOM. The drain electrode D of the fifth ESD protection transistor T41 is connected to the transistor short bar 50 through through-holes 45 and 52. The gate electrode G of the sixth ESD protection transistor T42 extends from the transistor short bar 50, and the source electrode S of the sixth ESD protection transistor T42 is connected to the transistor short bar 50 through the through-holes 45 and 52. The drain electrode D of the sixth ESD protection transistor T42 is connected to the common electrode VCOM through the source electrode S of the fifth ESD protection transistor T41. The ESD protection transistors (or diodes) T41 and T42 allow current to flow in two-way directions between the transistor short bar 50 and the common electrode VCOM.

The first repair line RL1 is insulated from and intersects the transistor short bar 50 and is disposed adjacent and parallel to the first data line DL1. In addition, the first repair line RL1 may be formed substantially simultaneously with the data lines DL1 to DLm. When a disconnection occurs in one of the data lines DL1 to DLm, a connection path of the corresponding data line DL is changed to be via the first repair line RL1 so that the data driving signal may continue to be applied to the disconnected data line. Such a repairing method is referred to as a ring repair method, and the repair method will be described in detail below with reference to FIGS. 6, 7 and 8.

The transistor short bar 50 may further include a narrow portion 51 at a connection portion between a portion of the transistor short bar 50 overlapping the first repair line RL1 and the ESD protection diodes T41 and T42. The narrow portion 51 corresponds to an area that is cut by a laser so that the data line is not shorted with the common electrode VCOM when the transistor short bar 50 is connected to the first repair line RL1 in the repair process. The narrow portion 51 may be cut by a laser beam and may be formed to have a narrower width than a width of other portions or wirings of the transistor short bar 50 to be easily recognizable and cut. In addition, only an insulating layer is disposed in an area corresponding to the narrow portion 51, and no other metal portion is disposed in the area corresponding to the narrow portion 51.

FIG. 6 is a mimetic view illustrating a disconnection state of a data line.

Referring to FIG. 6, a disconnection occurs at the second data line DL2 in the display area DA.

One side of each of the data lines DL1 to DLm is disposed in the first non-display area NDA1 and connected to a driving pad unit (not illustrated) that is connectable to terminals of the data driving units DIC1 to DICk. Another side of each of the data lines DL1 to DLm extends to the repair terminal portion 10 disposed in the second non-display area NDA2. After the data lines DL1 to DLm are formed, an open-short test is performed. In the open-short test, an inspection signal is applied to the data lines DL1 to DLm through the driving pad unit (not illustrated). The data lines DL1 to DLm at the repair terminal portion 10 may further include an inspection pad unit (not illustrated). An inspection probe (not illustrated) is brought into contact with the inspection pad unit to determine whether the inspection signal applied to the driving pad unit is detected, thereby determining a disconnected data line DL among the data lines DL1 to DLm. Even if a disconnection occurs in the data line DL, pixels PX disposed between the data driving unit DIC and the disconnected area may operate normally. However, pixels PX disposed beyond the disconnected area may not receive the data driving signal, and thus may not operate normally.

As a method of repairing such a disconnection in a data line, for example, the disconnected data line DL may be branched off from the first non-display area NDA1 and the data driving signal may be applied through the disconnected data line DL from the second non-display area NDA2.

FIG. 7 is a mimetic view illustrating a repair state of the disconnected data line.

In the repair process, a laser beam is irradiated from below the substrate to destroy an insulating layer between two facing metal layers to weld the two insulated metal layers. After the repair, the two facing metal layers are electrically connected to each other through the destroyed insulating layer.

In an exemplary embodiment, a thin film transistor of a bottom gate structure is used by way of example. The gate lines GL1 to GLn, the transistor short bar 50, and the second repair line RL2 are formed on a substantially same layer on the substrate. A gate insulating layer 55 (refer to FIG. 8C) is formed on the gate lines GL1 to GLn. Further, the data lines DL1 to DLm and the first repair line RL1 are formed on the gate insulating layer 55.

Referring to FIG. 7, an area irradiated with a laser repair beam includes a first repair point R1 at which the second data line DL2 intersects the transistor short bar 50, a second repair point R2 at which the transistor short bar 50 intersects the first repair line RL1, and a third repair point R3 at which the second data line DL2 intersects the second repair line RL2. In addition, an area that further irradiated with a laser beam includes a fourth repair point R4 at the narrow portion 51 of the transistor short bar 50 to disconnect the transistor short bar 50 from the common electrode VCOM.

The laser beam irradiated to the first repair point R1 connects the second data line DL2 and the transistor short bar 50 that are spaced apart from each other. The laser beam connects the transistor short bar 50 and the first repair line RL1 at the second repair point R2 and connects the second data line DL2 and the second repair line RL2 at the third repair point R3. At the fourth repair point R4, the narrow portion 51 of the transistor short bar 50 may be disconnected by the laser beam.

A transmission path of the data driving signal via the first and second repair lines RL1 and RL2 may be lengthened from a transmission path of the data driving signal via the data line DL that does not suffer from disconnection. The lengthened transmission path of the data driving signal may deteriorate the data driving signal. The data driving unit DIC may receive the data driving signal of the first repair line RL1, amplify the data driving signal, and output the amplified data driving signal. The amplified data driving signal may be transmitted to the second repair line RL2 to improve the deteriorated data driving signal.

The electric connection relationships among the repair points R1, R2, R3, and R4 are changed by the laser, and the data driving signal, as shown in bold in FIG. 7, of the first data driving unit DIC1 applied to the disconnected second data line DL2 may be transmitted beyond the disconnected area of the second data line DL2 through the following path: the second data line DL2-the transistor short bar 50-the first repair line RL1-the data driving unit DIC-the second repair line RL2.

In an exemplary embodiment, the first repair line RL1 and the second repair line RL2 may be directly connected to each other when the size of the display panel is small or the resistance of the electrode is low. In such an exemplary embodiment, the data driving signal may be transmitted without passing through the data driving unit DIC.

According to the present exemplary embodiment, it is described by way of example that the data driving unit DIC amplifies the data driving signal of the first repair line RL1. However, the data driving signal may be amplified using a separate driving circuit other than the data driving unit DIC.

FIG. 8A is a plan view illustrating area A of FIG. 1, and FIG. 8B is a cross-sectional view taken along line I-I' of FIG. 8A.

FIG. 8C is a plan view illustrating a second non-display area of the display panel.

Referring to FIGS. 8A and 8B, the first repair point R1 corresponds to an area in which the source electrode S of the fourth ESD protection transistor T32 connected to the second data line DL2 overlaps the transistor short bar 50. As the gate insulating layer 55 that insulates the source electrode S of the fourth ESD protection transistor T32 connected to the second data line DL2 is destroyed by a laser beam, the second data line DL2 and the transistor short bar 50 that are insulated by the gate insulating layer 55 are welded to be electrically connected to each other.

The second repair point R2 corresponds to an area in which the first repair line RL1 overlaps the transistor short bar 50. A laser beam is irradiated to the second repair point R2 such that the transistor short bar 50 and the first repair line RL1 are electrically connected to each other. As a result, the second data line DL2 and the first repair line RL1 may be electrically connected to each other by the laser beam irradiated to the first repair point R1 and the second repair point R2. The first repair line RL1 is connected to an input terminal of the data driving unit DIC. The data driving unit DIC amplifies the input data driving signal of the second data line DL2, and outputs the amplified data driving signal to the second repair line RL2 via the transistor short bar 50 and the first repair line RL1. The second repair line RL2 extends to the second non-display area NDA2.

Referring to FIG. 8C, the second repair line RL2 is insulated from and intersects the data lines DL1 to DLm. The third repair point R3 corresponds to an area in which the second data line DL2 overlaps the second repair line RL2. The second repair line RL2 may be formed substantially simultaneously with the gate lines GL1 to GLn of the display area DA. Further, the second repair line RL2 is insulated from the data lines DL1 to DLm by the gate insulating layer 55.

After a laser beam is irradiated to the third repair point R3, the gate insulating layer 55 that insulates the second data line DL2 from the second repair line RL2 is destroyed, and the second repair line RL2 and the second data line DL2 may be electrically connected to each other.

As described above, the transistor short bar 50 for protecting the driving elements of the display panel from ESD is configured to be used as a repair line for repairing disconnection of a data line. As a result, the size of the non-display area may be reduced by about 50% or more compared to a display panel that includes discrete elements for protecting the driving elements and a repair line.

As set forth hereinabove, according to one or more exemplary embodiments, the short bar may substantially prevent damage on the driving circuit of the display panel caused by ESD generated during the manufacturing process, and may also be used as a repair line in a case where disconnection occurs in a data line, thereby providing a display panel with a reduced non-display area. Accordingly, a slim display panel having a reduced non-display area may serve functions of both the ESD protection circuit and the repair line.

While the present disclosure has been illustrated and described with reference to the exemplary embodiments thereof, it will be apparent to those of ordinary skill in the art that various changes in form and detail may be formed thereto without departing from the spirit and scope of the present disclosure.

What is claimed is:

1. A display panel comprising:
   a substrate comprising a display area, a first non-display area, and a second non-display area, the first non-display area and the second non-display area facing each other with the display area disposed therebetween;
   a gate line disposed on the substrate and extending in a first direction;
   a data line disposed on the substrate and extending in a second direction that intersects the first direction;
   a data driving unit generating a driving signal applied to the data line;
   an electrostatic discharge protection transistor unit disposed in the first non-display area and comprising a thin film transistor, one of a source electrode and a drain electrode of the thin film transistor being connected to the data line;
   a transistor short bar connected to a gate electrode of the thin film transistor;
   a first repair line overlapping the transistor short bar on a plane; and
   a second repair line electrically connected to the first repair line and overlapping the data line on the plane in the second non-display area.

2. The display panel as claimed in claim 1, wherein the first repair line is disposed on a different layer from a layer on which the second repair line is disposed, and
   the first repair line is connected to the second repair line through a through-hole.

3. The display panel as claimed in claim 2, wherein the first repair line and the data line include a substantially same material.

4. The display panel as claimed in claim 2, wherein the second repair line and the gate line include a substantially same material.

5. The display panel as claimed in claim 1, wherein one of the source electrode and the drain electrode of the thin film transistor that is not connected to the data line is floated.

6. The display panel as claimed in claim 1, further comprising an electrostatic discharge protection diode connected between the transistor short bar and a common electrode.

7. The display panel as claimed in claim 6, wherein the transistor short bar comprises a narrow portion between the thin film transistor and the electrostatic discharge protection diode, and
   a width of the narrow portion is less than a width of a wiring connected to the electrostatic discharge protection diode.

8. The display panel as claimed in claim 7, wherein the narrow portion does not overlap another metal layer on the plane.

9. The display panel as claimed in claim 1, wherein the electrostatic discharge protection transistor unit comprises a plurality of thin film transistors connected in parallel to each other.

10. The display panel as claimed in claim 1, wherein the one of the source electrode or the drain electrode of the thin film transistor connected to the data line is electrically connected to the transistor short bar,
    the transistor short bar is electrically connected to the first repair line at a portion of the transistor short bar overlapping the first repair line, and
    the second repair line is electrically connected to the data line at a portion of the second repair line overlapping the data line.

11. A display panel comprising:
a substrate comprising a display area, a first non-display area, and a second non-display area, the first non-display area, and the second non-display area facing each other with the display area disposed therebetween;
a gate line disposed on the substrate and extending in a first direction;
a data line disposed on the substrate and extending in a second direction that intersects the first direction;
a data driving unit generating a driving signal applied to the data line;
an electrostatic discharge protection transistor unit disposed in the first non-display area and comprising a thin film transistor, one of a source electrode and a drain electrode of the thin film transistor being connected to the data line;
a transistor short bar connected to a gate electrode of the thin film transistor;
a first repair line overlapping the transistor short bar on a plane;
a signal amplifier connected to the first repair line and configured to amplify a driving signal of the first repair line; and
a second repair line connected to an output terminal of the signal amplifier and overlapping the data line on the plane in the second non-display area.

12. The display panel as claimed in claim 11, wherein the data driving unit comprises the signal amplifier.

13. The display panel as claimed in claim 12, wherein the first repair line and the data line include a substantially same material.

14. The display panel as claimed in claim 12, wherein the second repair line and the gate line include a substantially same material.

15. The display panel as claimed in claim 11, wherein the one of the source electrode or the drain electrode of the thin film transistor connected to the data line is electrically connected to the transistor short bar,
the transistor short bar is electrically connected to the first repair line at a portion of the transistor short bar overlapping the first repair line, and
the second repair line is electrically connected to the data line at a portion of the second repair line overlapping the data line.

* * * * *